(12) United States Patent
Lee et al.

(10) Patent No.: US 8,284,953 B2
(45) Date of Patent: Oct. 9, 2012

(54) CIRCUIT AND METHOD OF REDUCING POP-UP NOISE IN A DIGITAL AMPLIFIER

(75) Inventors: Soo-Hyoung Lee, Yongin-si (KR); Wang-Seup Yeum, Yongin-si (KR); Yong-Jin Cho, Incheon (KR); In-Bock Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1393 days.

(21) Appl. No.: 11/873,179

(22) Filed: Oct. 16, 2007

(65) Prior Publication Data

US 2008/0089532 A1    Apr. 17, 2008

(30) Foreign Application Priority Data

Oct. 16, 2006    (KR) .................. 10-2006-0100242

(51) Int. Cl.
*H04B 15/00*    (2006.01)
*H03G 11/00*    (2006.01)
*H04R 29/00*    (2006.01)
*H02B 1/00*    (2006.01)
*H03F 1/14*    (2006.01)
*H03F 3/38*    (2006.01)

(52) U.S. Cl. .......... 381/94.5; 381/55; 381/58; 381/94.8; 381/123; 330/10; 330/50

(58) Field of Classification Search ................. 381/95.4, 381/95.8, 55, 58, 123; 330/50, 10
See application file for complete search history.

(56) References Cited

U.S. PATENT DOCUMENTS 6,118,336 A * 9/2000 Pullen et al. ................. 330/10

2007/0009110 A1 * 1/2007 Kakumoto et al. ........... 381/104
2007/0076903 A1 * 4/2007 Shimomura et al. ......... 381/94.5

FOREIGN PATENT DOCUMENTS

| JP | 07-041208 | 9/1995 |
| JP | 2004-040364 | 5/2004 |
| JP | 2005-159871 | 6/2005 |
| KR | 2000-0011933 | 7/2000 |
| KR | 1020040007161 | 1/2004 |
| WO | WO 2006/031304 | 3/2006 |

OTHER PUBLICATIONS

English Abstract for Publication No. 1020040007161, 2012.
English Abstract for Publication No. 2000-0011933, 2012.
English Abstract for Publication No. 2005-159871, 2012.
English Abstract for Publication No. 07-041208, 2012.
English Abstract for Publication No. 2004-040364, 2012.
Japanese Office Action dated Jan. 24, 2012.

* cited by examiner

*Primary Examiner* — Vivian Chin
*Assistant Examiner* — Douglas Suthers
(74) *Attorney, Agent, or Firm* — F. Chau & Associates, LLC (57) ABSTRACT

A circuit of reducing a pop-up noise in a digital amplifier includes a switch unit and a switch signal generator. The switch unit is coupled in parallel to an output load between an output node of the digital amplifier and a reference node. The switch unit controls a current flowing through the output load by forming a conduction path between the output node and the reference node in response to a switch signal. The switch signal generator generates the switch signal in response to a switch control signal indicating a power-on or a power-off. The pop-up noise is reduced by the conduction path that is formed when the digital amplifier is powered on or off.

25 Claims, 7 Drawing Sheets

CIRCUIT AND METHOD OF REDUCING POP-UP NOISE IN A DIGITAL AMPLIFIER

CROSS-REFERENCE TO RELATED APPLICATIONS

This application claims priority under 35 USC §119 to Korean Patent Application No. 10-2006-0100242, filed on Oct. 16, 2006 in the Korean Intellectual Property Office (KIPO), the disclosure of which is herein incorporated by reference in its entirety.

BACKGROUND OF THE INVENTION

1. Technical Field

The present invention relates to a digital amplifier, and more particularly to a circuit and a method of reducing pop-up noise in a digital amplifier.

2. Discussion of the Related Art

Audio amplifiers are typically classified as either class-A, class-B, class-AB, or class-D according to a driving circuit of the audio amplifier known as the output stage.

In the class-A output stage, bias voltages are applied to output transistors in a mute state, in which no signal is output, and a bias current flows through the output transistors in the mute state. Thus the class-A output stage has high thermal dissipation and low thermal efficiency. The class-B output stage is configured to prevent the bias current in the mute state. Significant crossover distortion, however, is caused in the class-B output stage when the output signal passes through a reference voltage, that is, when the output transistors are turned off. The class-AB output stage is configured to have a small bias current in the mute state to achieve the lower distortion of the class-A configuration and the higher efficiency of the class-B configuration. The crossover distortion, however, still exists and a high-capacity heat sink is required in the class-AB output stage.

The class-D output stage includes transistors operating as an ON/OFF switch. A turn-on resistance of the transistors is relatively small and thus the class-D output stage has a high efficiency. According to an IEC (International Electrotechnical Commission) standard, the class-D amplifier is defined as any amplifier, "in which the current in each active device supplying the load is switched from zero to a maximum value by a carrier signal, modulation of which conveys the useful signal." Accordingly the class-D output stage includes all of the output stages, that is, the driving circuits are operated by a switching amplification regardless of whether an analog input or a digital input is received and regardless of the types of the internal signal processes used.

The audio amplifiers including such a class-D output stage or a class-D driving circuit are referred to as digital amplifiers or digital amps.

Figure 1:
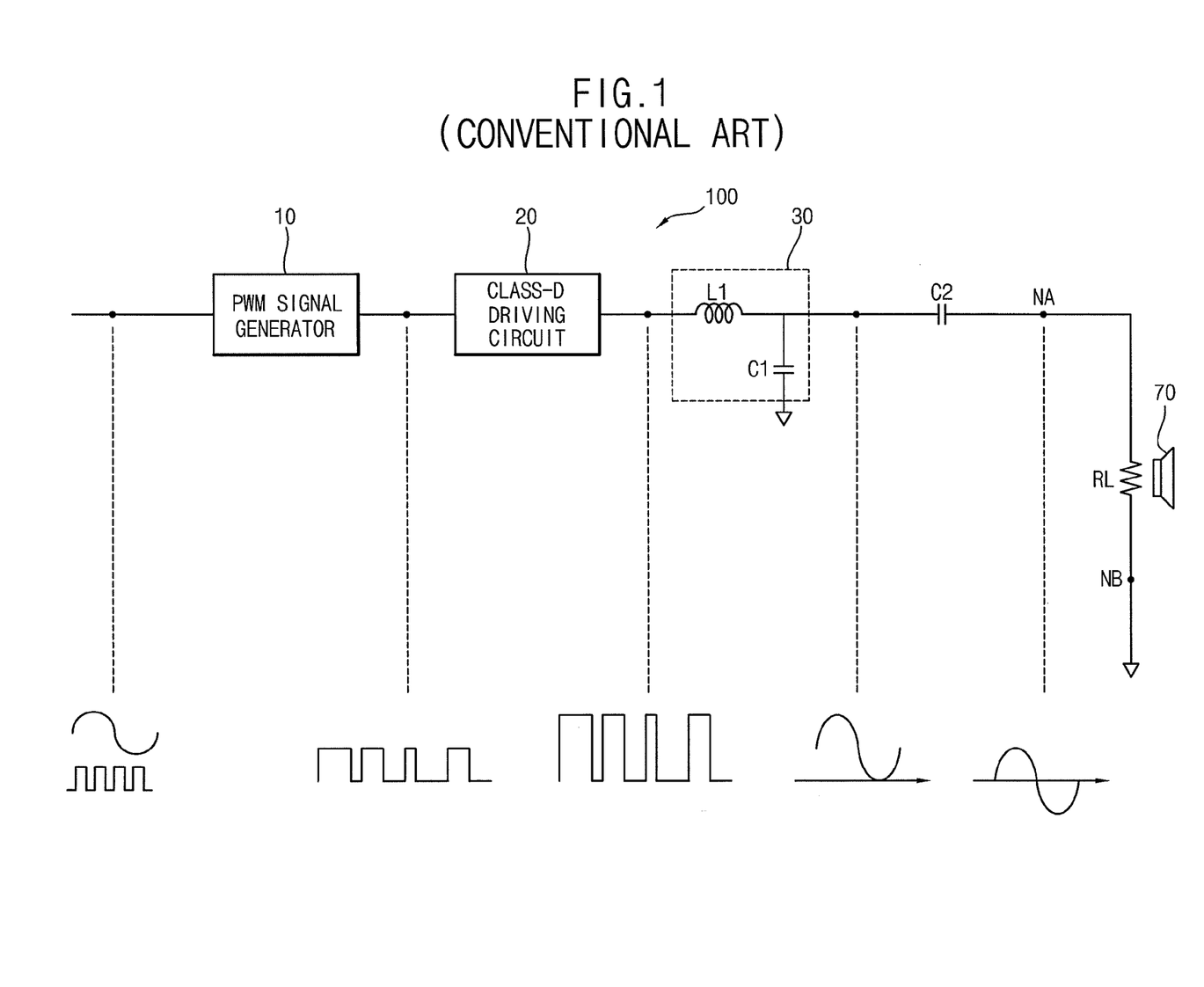
FIG. 1 is a diagram illustrating a conventional digital amplifier.

FIG. 1 is a diagram illustrating a conventional digital amplifier.

Referring to FIG. 1, the digital amplifier 100 includes a pulse width modulation (PWM) signal generator 10, a class-D driving circuit 20, a low-pass filter 30, and a coupling capacitor C2. Sound waves are generated through an output load RL coupled between an output node NA and a ground electrode. The output load RL is a load of a speaker 70 included in a headset, an earphone, etc.

The PWM signal generator 10 receives an audio signal of analog or digital type, and modulates the received audio signal to output a PWM signal. The PWM signal is a digital signal in which levels of the audio signal are transformed into time information of pulse widths.

The class-D driving circuit 20 receives and amplifies the PWM signal and outputs the amplified PWM signal. The class-D driving circuit 20 may be classified as either a half bridge or a full bridge in which two half bridges are combined. Under the same power supply voltage, the full bridge can provide a power two times greater than that of the half bridge. The power can be provided by a single power supply voltage or by two power supply voltages. Where the half bridge is used with the single power supply voltage, a DC voltage corresponding to a half of the power supply voltage is output and thus the coupling capacitor requires a high capacitance.

Power metal-oxide semiconductor field effect transistors (MOSFETs) of a complementary type, in which a P-channel transistor and an N-channel transistor are combined, are widely used as switching elements of the class-D driving circuit. The class-D driving circuit 20 may include a level shifter for increasing a reference level of the PWM signal, a deadtime circuit for preventing the two power MOSFETs from being simultaneously turned on, and a bootstrap circuit functioning as a floating power source.

The low-pass filter 30 averages a level of the output signal of the class-D driving circuit, and removes high bandwidth noise to output an analog signal to the output load RL of the speaker 70.

When the digital amplifier is powered on or off, a surge pulse may be generated due to instability of internal circuits and so on and the surge pulse is amplified by the driving circuit. The amplified surge pulse causes a noise, that is, an unpleasant sound through the speaker, and such noise is referred to as a pop-up noise.

In the digital amplifier 100 that is powered by a single power supply voltage, the pop-up noise can be reduced by coupling a relay between the low-pass filter 20 and the output load RL such that the relay is open until the digital amplifier is stabilized. The relay for reducing the pop-up noise, however, increases a size of the digital amplifier 100. Thus the relay is not particularly suitable for mobile devices.

A digital amplifier, in which a negative power supply voltage (−VDD) is generated by a charge pump or a DC-DC converter based on a power supply voltage (VDD), is disclosed in PCT patent publication No. 2006/031304. A driving circuit of the digital amplifier is operated by the two power supply voltages, that is, VDD and −VDD, and thus the coupling capacitor can be excluded. In such digital amplifiers without the coupling capacitor, the relay is ineffective for reducing the pop-up noise.

SUMMARY OF THE INVENTION

Some exemplary embodiments of the present invention provide a circuit for reducing pop-up noises caused when a digital amplifier is powered on or off.

Some exemplary embodiments of the present invention provide a digital amplifier including the circuit for reducing pop-up noises.

Some exemplary embodiments of the present invention provide a method of reducing pop-up noises caused when a digital amplifier is powered on or off.

In some exemplary embodiments of the present invention, a circuit for reducing a pop-up noise in a digital amplifier includes a switch unit and a switch signal generator. The switch unit is coupled in parallel to an output load between an output node of the digital amplifier and a reference node. The switch unit controls a current flowing through the output load by forming a conduction path between the output node and the reference node in response to a switch signal. The switch signal generator generates the switch signal in response to a switch control signal indicating information on the timing of power-on and power-off.

A voltage of the reference node may be maintained at an average of a first power supply voltage and a second power supply voltage during a normal operation of the digital amplifier. A voltage of the output node may be maintained at the voltage of the reference node during a mute operation of the digital amplifier, and the voltage of the output node may swing between the first power supply voltage and the second power supply voltage during the normal operation of the digital amplifier.

In some embodiments, the switch unit may include a switch coupled between the output node and the reference node, and the switch may operate in response to the switch signal.

The switch may be an NMOS transistor, and the switch signal generator may output the switch signal of logic high to a gate of the NMOS transistor when the digital amplifier is powered on or off.

In some embodiments, the circuit may further include a smoothing unit coupled between the switch signal generator and the switch unit. The smoothing unit prolongs a transition time of the switch signal output to the switch unit. The smoothing unit may be implemented with an RC circuit including a resistor and a capacitor.

In some embodiments, the switch unit may include a plurality of NMOS transistors coupled in parallel to each other between the output node and the reference node, and each gate of the NMOS transistors receives the respective switch signal.

The circuit may further include a smoothing unit coupled between the switch signal generator and the switch unit such that the smoothing unit prolongs a transition time of the switch signal output to the switch unit. The smoothing unit may include a plurality of RC circuits coupled to gates of the NMOS transistors, respectively, and each RC circuit includes a resistor and a capacitor.

The switch signal generator may generate a plurality of switch signals in response to the switch control signal such that the switch signals are respectively output to each gate of the NMOS transistors and such that the switch signals sequentially transition to logic high.

For example, the switch signal generator may include a plurality of delay buffers configured to sequentially delay the switch control signal to sequentially transition the switch signals to logic high.

Alternatively the switch signal generator may include a plurality of flip-flops configured to generate the switch signals in response to the switch control signal and a clock signal such that the switch signals transition to logic high sequentially in one clock cycle of the clock signal.

In some embodiments, the NMOS transistors may have turn-on resistances different from each other. The NMOS transistor having a higher turn-on resistance may be turned on before the NMOS transistor having a lower turn-on resistance is turned on.

In some exemplary embodiments of the present invention, a digital amplifier for deriving an output load that is coupled between an output node and a reference node, includes a class-D driving circuit, a low-pass filter, a reference voltage generator and a pop-up noise reduction circuit.

The class-D driving circuit amplifies a pulse width modulation (PWM) signal based on a first power supply voltage and a second power supply voltage to output the amplified PWM signal. The low-pass filter converts the amplified PWM signal to an analog signal to output the analog signal to the output node. The reference voltage generator outputs a reference voltage to the reference node. The reference voltage corresponds to an average of the first power supply voltage and the second power supply voltage. The pop-up noise reduction circuit controls a current flowing through the output load by forming a conduction path between the output node and the reference node in response to a switch control signal indicating information on the timing of a power-on or a power-off.

The voltage of the output node may be maintained at the reference voltage during a mute operation of the digital amplifier, and the voltage of the output node may swing between the first power supply voltage and the second power supply voltage during a normal operation of the digital amplifier.

The pop-up noise reduction circuit may include a switch unit and a switch signal generator. The switch unit is coupled in parallel to the output load between the output node and the reference node. The switch unit controls the current flowing through the output load by forming N number of conduction paths between the output node and the reference node in response to N number of switch signals, where N is a natural number. The switch signal generator generates the switch signals in response to the switch control signal.

The switch unit may include N number of MOS transistors coupled in parallel to each other between the output node and the reference node, and each gate of the MOS transistors receives the respective switch signal. For example, the MOS transistors may be NMOS transistors.

The pop-up noise reduction circuit may further include a smoothing unit coupled between the switch signal generator and the switch unit. The smoothing unit prolongs transition times of the switch signals output to the switch unit. The smoothing unit may include N number of RC circuits coupled to gates of the MOS transistors, respectively, and each RC circuit may include a resistor and a capacitor.

The switch signal generator may generate the switch signals in response to the switch control signal and the switch signals are respectively output to each gate of the NMOS transistors such that the switch signals sequentially transition to logic high.

The switch signal generator may include a plurality of flip-flops configured to generate the switch signals in response to the switch control signal and a clock signal such that the switch signals transition to logic high sequentially in one clock cycle of the clock signal.

The MOS transistors may each have different turn-on resistances. The MOS transistor having a higher turn-on resistance may be turned on before the MOS transistor having a lower turn-on resistance is turned on.

In some exemplary embodiments of the present invention, according to a method of reducing a pop-up noise in a digital amplifier, which drives an output load that is coupled between an output node and a reference node, a conduction path is formed between the output node and the reference node in response to a switch control signal indicating information on the timing of a power-on or a power-off. A pulse width modulation (PWM) signal is amplified based on a first power supply voltage and a second power supply voltage, and the amplified PWM signal is converted to an analog signal, which is output the analog signal to the output node. A reference voltage is applied to the reference node. The reference voltage corresponds to an average of the first power supply voltage and the second power supply voltage.

In forming the conduction path between the output node and the reference node, at least one switch may be coupled in parallel between the output node and the reference node and the at least one switch is turned on in response to the switch control signal. The at least one switch may be turned off after voltages of the output node and the reference node are stabilized.

The at least one switch may include a plurality of NMOS transistors and the NMOS transistors may be sequentially turned on.

The NMOS transistors may have different turn-on resistances, and the NMOS transistor having a higher turn-on resistance may be turned on before the NMOS transistor having a lower turn-on resistance is turned on.

As such, the pop-up noise, which is caused when the digital amplifier is powered on or off, can be reduced by forming the conduction path in parallel to the output load.

BRIEF DESCRIPTION OF THE DRAWINGS

The above and other features and aspects of the exemplary embodiments of the present invention will be described in detail with reference to the accompanying drawings, in which.

DETAILED DESCRIPTION OF EXEMPLARY EMBODIMENTS

Exemplary embodiments of the present invention are described more fully below with reference to the accompanying drawings. This invention may, however, be embodied in many different forms and should not be construed as limited to the embodiments set forth herein. Like reference numerals may refer to like elements throughout this application.

Figure 2:
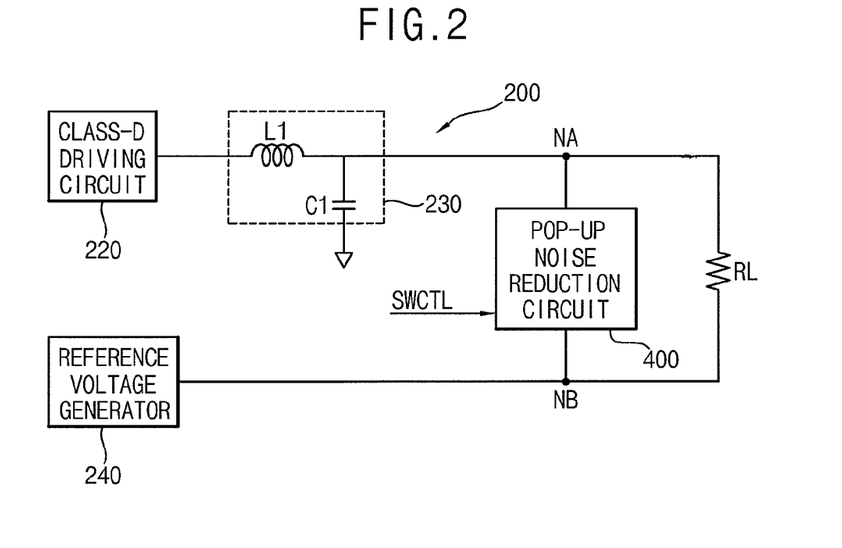
FIG. 2 is a block diagram illustrating a digital amplifier including a pop-up noise reduction circuit according to an exemplary embodiment of the present invention.

FIG. 2 is a block diagram illustrating a digital amplifier including a pop-up noise reduction circuit according to an exemplary embodiment of the present invention.

Referring to FIG. 2, the digital amplifier 200 includes a class-D driving circuit 220, a low-pass filter 230, a reference voltage generator 240 and a pop-up noise reduction circuit 400. An output load RL of a sound generation device such as a speaker may be coupled between an output node NA and a reference node NB of the digital amplifier 200.

The class-D driving circuit 220 receives and amplifies a PWM signal and outputs the amplified PWM signal. Power metal-oxide semiconductor field effect transistors (MOS-FETs) of a complementary type may be used as switching elements of the class-D driving circuit 220. The class-D driving circuit 220 outputs the amplified PWM signal having a duty ratio of 1/2 during a mute operation, and outputs the amplifier PWM signal modulated according to an audio signal during a normal operation.

The class-D driving circuit 220 may include a level shifter for increasing a reference level of the PWM signal to drive the power MOSFETs, a deadtime circuit for preventing the two power MOSFETs from being simultaneously turned on, and a bootstrap circuit functioning as a floating power source. The class-D driving circuit 220 may also include a mute control circuit and a power detection circuit that generates a switch control signal SWCTL by detecting whether the digital amplifier 200 is powered on or off. For example, the switch control signal SWCTL may be a typical power-on reset (POR) signal or may be generated based on the POR signal.

The low-pass filter 230 averages a level of the output signal of the class-D driving circuit, and removes noises of a high bandwidth to output an analog signal to the output load RL of the speaker.

The reference voltage generator 240 generates a reference voltage VR corresponding to an average of a first power supply voltage and a second power supply voltage, and outputs the reference voltage VR to the reference node NB that is coupled to one end of the output load RL. When the class-D driving circuit 220 performs a switching operation, for example, when the power MOSFETs are complementarily turned on and off, based on a higher power supply voltage VDD and a lower power supply voltage VSS, the reference voltage generator 240 generates the reference voltage VR corresponding to the average (VDD+VSS)/2 of the higher power supply voltage VDD and the lower power supply voltage VSS. The reference voltage generator 240 outputs the reference voltage VR to the reference node NB so that a voltage of the reference node NB may be maintained at the average value of the operation voltage of the class-D driving circuit 220. Accordingly a voltage difference VA-VB between both ends of the output load RL, for example, between the output node NA and the reference node NB, becomes zero, and thus a coupling capacitor in a conventional digital amplifier can be excluded.

When the digital amplifier 200 operates in a mute state, the class-D driving circuit 220 outputs the amplified PWM signal having a duty ratio of 1/2. After power of the class-D driving circuit 220 is stabilized, the output node NA is maintained at a level of the reference voltage VR since the amplified PWM signal having the duty ratio of 1/2 is applied to the low-pass filter 230. In an initial state when the applied power is unstable, the voltage difference VB-VA between the output node NA and the reference node NB may be non-zero, and a pop-up noise may be caused.

Figure 3:
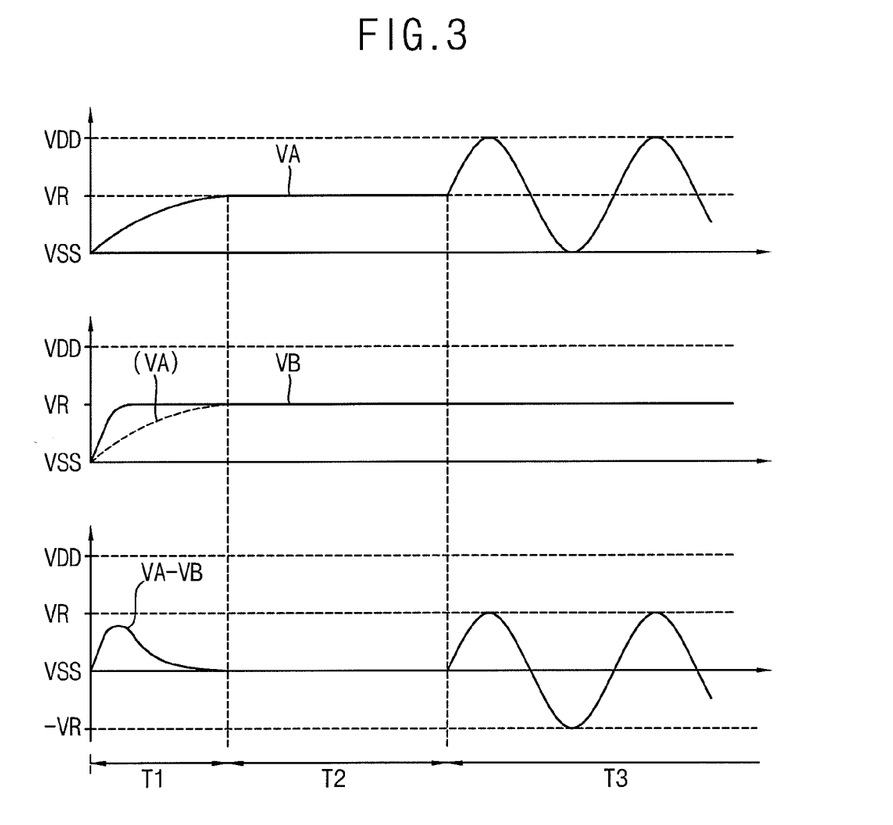
FIG. 3 is a waveform diagram illustrating possible pop-up noise in a digital amplifier.

FIG. 3 is a waveform diagram illustrating a possible pop-up noise in a digital amplifier.

FIG. 3 illustrates the voltages VA of the output node NA and the voltage VB of the reference nodes NB when the class-D driving circuit 220 and the reference voltage generator 240 are simultaneously powered on. In addition, the voltage difference VA-VB between the output node NA and the reference node NB, when the pop-up noise reduction circuit 400 is not operated, is also illustrated in FIG. 3.

In initial period T1, when the class-D driving circuit 220 and the reference voltage generator 240 are powered on, the voltage VB is set to the reference voltage VR faster than the voltage VA since an increase of the voltage VA is delayed due to charging of the low-pass filter 230. In mute period T2, both of the voltages VA and VB are maintained at the level of the reference voltage VR. The mute state represents a state in which the amplified PWM signal having the duty ratio of 1/2 is output by the class-D driving circuit 220, and thus the voltage VA is maintained at the reference voltage VR regardless of the audio signal. In normal period T3, the mute state is ceased, and a signal having a waveform corresponding to the audio signal is transferred to the output load RL.

As illustrated in FIG. 3, the voltage difference VA-VB in initial period T1 generates a current flowing through the output load RL and thus causes a pop-up noise if the pop-up noise reduction circuit 400 is not operated.

Referring back to FIG. 2, the pop-up noise reduction circuit 400 reduces the current flowing the output load RL by the voltage difference VA-VB between the output node NA and the reference node NB. The pop-up noise reduction circuit 400 controls the current flowing through the output load RL by forming a conduction path between the output node NA and the reference node NB in response to the switch signal SWCTL. The conduction path is formed in parallel to the output load RL, and thus the current flowing through the output load RL is further decreased as the resistance of the conduction path becomes smaller. As such, the pop-up noise can be reduced.

Figure 4:
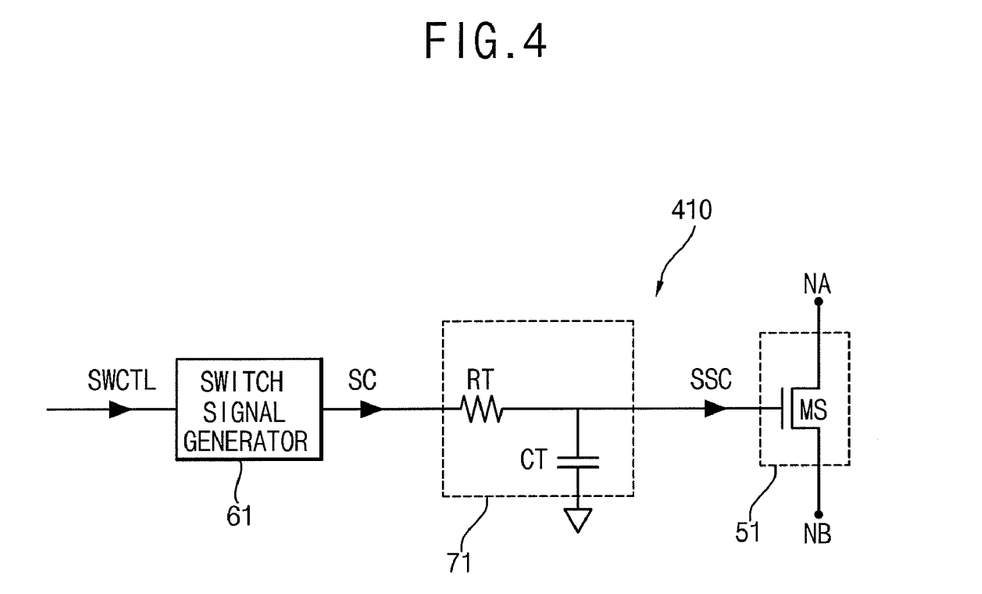
FIG. 4 is a circuit diagram illustrating a pop-up noise reduction circuit according to an exemplary embodiment of the present invention.

FIG. 4 is a circuit diagram illustrating a pop-up noise reduction circuit according to an exemplary embodiment of the present invention.

Referring to FIG. 4, the pop-up noise reduction circuit 410 includes a switch unit 51 and a switch signal generator 61. The pop-up noise reduction circuit 410 may further include a smoothing unit 71 between the switch unit 51 and the switch signal generator 61.

The switch unit 51 is coupled in parallel to an output load RL between an output node NA of the digital amplifier and a reference node NB. The switch unit 51 controls a current flowing through the output load RL by forming a conduction path between the output node NA and the reference node NB in response to a switch signal SC. If the smoothing unit 71 is further included between the switch unit 51 and the switch signal generator 61, the conduction path is formed in response to a smooth switch signal SSC. The switch signal generator 61 generates the switch signal SC in response to a switch control signal SWCTL indicating information on the timing of a power-on or a power-off. The switch control signal SWCTL may be provided from a power detection unit (not shown) that can be included in the class-D driving circuit or other function blocks of the digital amplifier.

The switch unit 51 may include a switching element coupled between the output node NA and the reference node NB. The switching element operates in response to the switch signal SC. For example, when the switching element is implemented with an NMOS transistor MS, the switch signal generator 61 outputs the switch signal of logic high to a gate of the NMOS transistor MS when power is on or off.

When a single conduction path is formed between the output node NA and the reference node NB as illustrated in FIG. 4, the switch signal generator 61 may be omitted and the switch control signal SWCTL may be directly applied to the switch unit 51.

The switch control signal SWCTL may transition when it is detected that the digital amplifier 400 is powered on or off, for example, from logic low to logic high. The switch signal generator 61 outputs the switch signal SC of logic high in response to the transition of the switch control signal SWCTL. When the switch signal SC, which is applied to the gate of the NMOS transistor MS, transitions to logic high, the NMOS transistor MS is turned on and thus a conduction path is formed between the output node NA and the reference node NB. While the conduction path is formed, the class-D driving circuit 220 and the reference voltage generator 240 are powered on. Accordingly the pop-up noise is prevented by the conduction path formed in parallel to the output load RL even though the voltage difference VA-VB does not correspond to zero. After the voltages VA and VB of the nodes NA and NB are stabilized, the switch signal SC transitions to logic low and the NMOS transistor MS is turned off.

The voltages of the output node NA and the reference node NB are desirable to be maintained at the same level after applied power is stabilized. An offset between the voltages of the output node NA and the reference node NB, however, may be present due to limitations of manufacturing processes, etc. Such an offset may cause a pop-up noise when the class-D driving circuit 220 and/or the reference voltage generator 240 are/is abruptly powered off. Additionally the digital amplifier may be configured such that the conduction path is also formed when the digital amplifier is powered off.

The pop-up noise may be caused if the NMOS transistor MS is rapidly turned on causing a surge current to be generated. As such, the transition of the switch signal SC applied to the gate of the NMOS transistor MS may be alleviated to reduce the pop-up noise due to sudden turn-on or turn-off of the NMOS transistor MS.

The smoothing unit 71 is coupled between the switch unit 51 and the switch signal generator 61. The smoothing unit 71 prolongs a transition time of the switch signal to output the smooth switch signal SSC. For example, the smoothing unit may include an RC circuit configured with a resistor RT and a capacitor CT as illustrated in FIG. 4.

Figure 5:
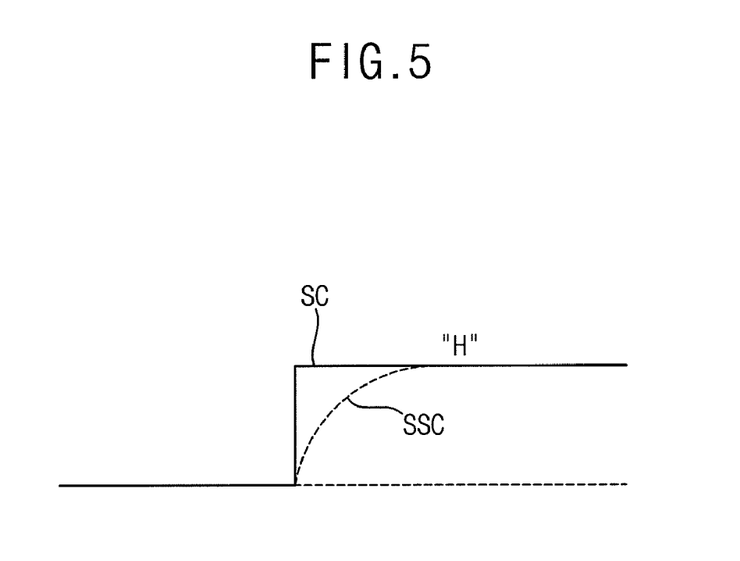
FIG. 5 is a waveform diagram illustrating a switch signal and a smoothed switch signal.

FIG. 5 is a waveform diagram illustrating a switch signal and a smoothed switch signal.

As illustrated in FIG. 5, even though the switch signal SC transitions rapidly, the smooth switch signal SSC from the smoothing unit 71 transitions slowly to logic high. As such, the pop-up noise due to sudden turn on of the NMOS transistor MS can be decreased or prevented. When the smoothing unit 71 is implemented with the resistor RT and the capacitor CT as illustrated in FIG. 4, the transition time of the smooth switch signal SSC depends on a time constant related with a resistance of the resistor RT and a capacitance of the capacitor CT. When the NMOS transistor MS is turned off, the smoothing unit 71 prolongs a transition time from logic high to logic low, and thus the pop-up noise due to sudden turn off of the NMOS transistor MS can also be decreased or prevented.

Figure 6:
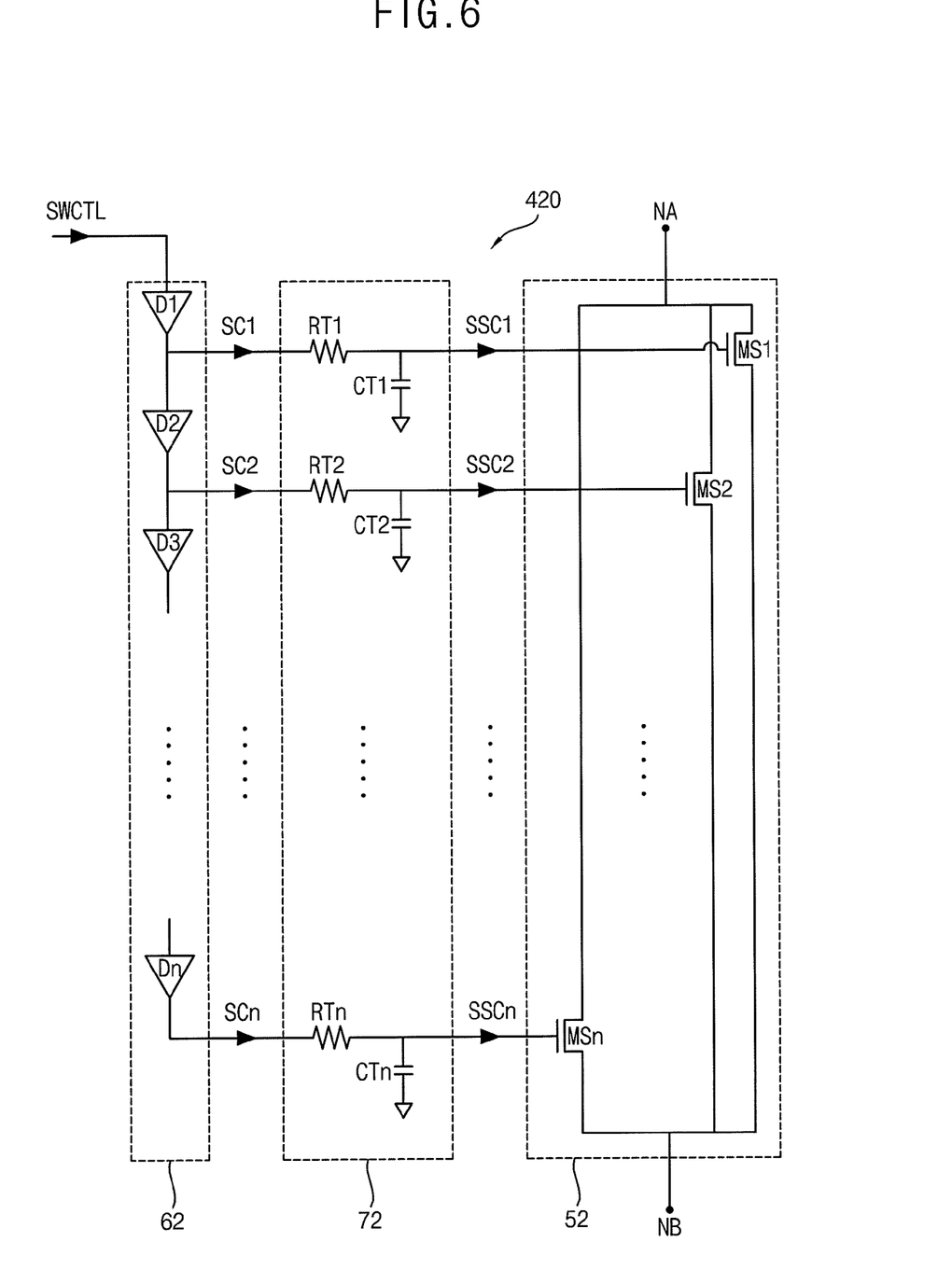
FIG. 6 is a circuit diagram illustrating a pop-up noise reduction circuit according to an exemplary embodiment of the present invention.

FIG. 6 is a circuit diagram illustrating a pop-up noise reduction circuit according to an exemplary embodiment of the present invention.

Referring to FIG. 6, the pop-up noise reduction circuit 420 includes a switch unit 52 and a switch signal generator 62. The pop-up noise reduction circuit 420 may further include a smoothing unit 72 between the switch unit 52 and the switch signal generator 62.

The switch unit 52 is coupled in parallel to an output load RL between an output node NA of the digital amplifier and a reference node NB. The switch unit 52 may include a plurality of NMOS transistors MS1 through MSn receiving switch signals SC1 through SCn at each gate. The NMOS transistors are coupled in parallel between the output node NA and the reference node NB and thus the switch unit 52 controls a current flowing through the output load RL by forming conduction paths between the output node NA and the reference node NB in response to the switch signals SC1 through SCn. If the smoothing unit 72 is further included between the switch unit 52 and the switch signal generator 62, the conduction paths are formed in response to smooth switch signals SSC1 through SSCn.

The NMOS transistors MS1 through MSn may have different turn-on resistances, and the pop-up noise reduction circuit can be configured such that the NMOS transistor having a higher turn-on resistance is turned on before the NMOS transistor having a lower turn-on resistance is turned on.

The switch signal generator 62 generates switch signals SC1 through SCn in response to the switch control signal SWCTL such that the switch signals SC1 through SCn sequentially transition to logic high and are respectively output to each gate of the NMOS transistors MS1 through MSn.

For example, the switch signal generator 62 may include a plurality of delay buffers D1 through Dn configured to sequentially delay the switch control signal SWCTL to generate the switch signals SC1 through SCn sequentially transitioning to logic high.

The pop-up noise reduction circuit 420 may further include the smoothing circuit 72 coupled between the switch unit 52 and the switch signal generator 62. The smoothing unit 72 may include a plurality of RC circuits that include resistors RT1 through RTn and capacitors CT1, through CTn, respectively. The smoothing unit 72 prolongs transition times of the switch signals SC1 through SCn and outputs the smooth switch signals SSC1 through SSCn.

Hereinafter, an operation of the pop-up noise reduction circuit 420 will be described with reference to FIG. 7.

Figure 7:
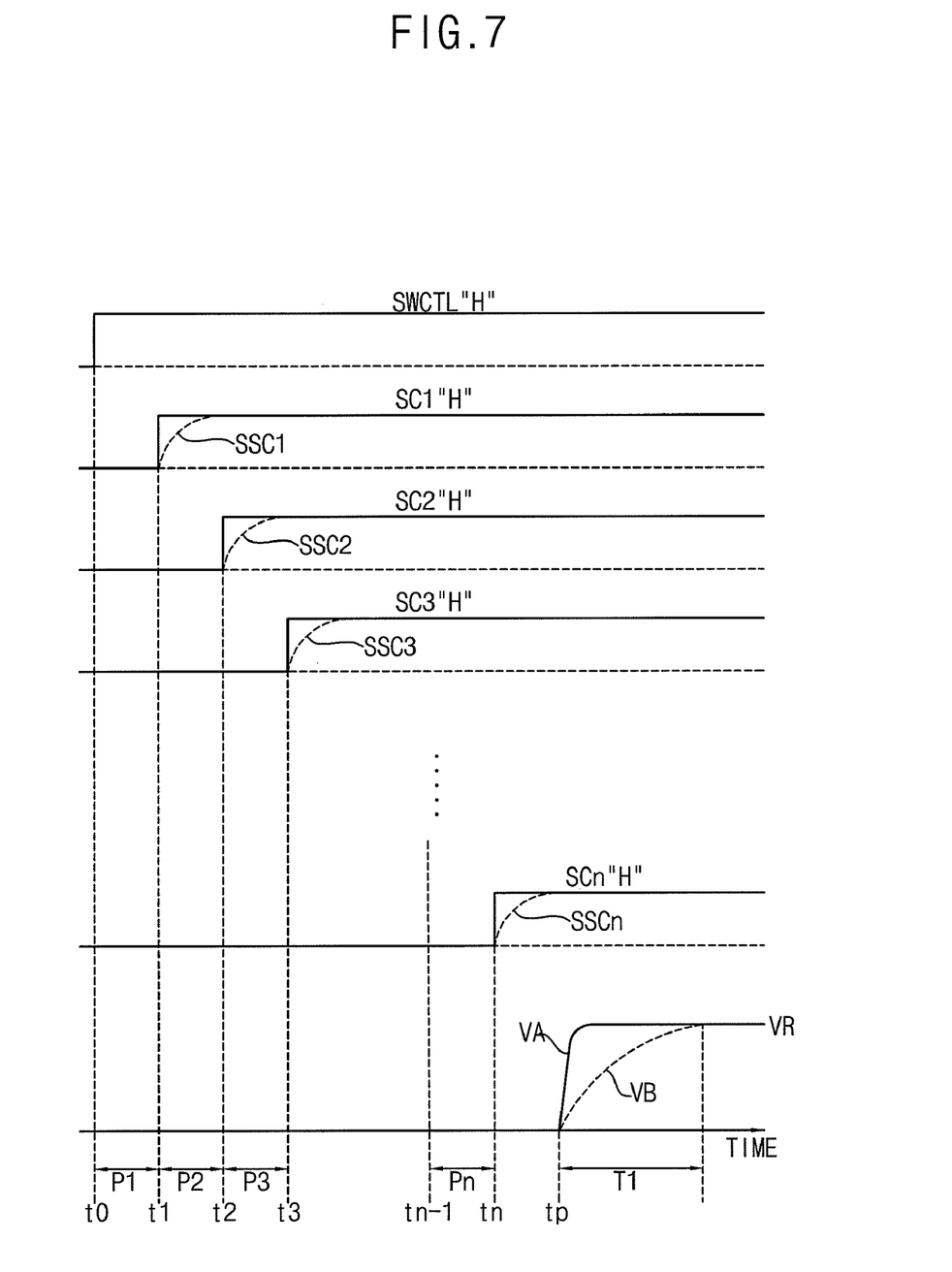
FIG. 7 is a waveform diagram illustrating signals in the pop-up noise reduction circuit of FIG. 6.

FIG. 7 is a waveform diagram illustrating signals in the pop-up noise reduction circuit of FIG. 6.

The switch control signal SWCTL transitions when the digital amplifier is powered on or powered off, for example, from logic low to logic high. The switch signal generator 62 generates switch signals SC1 through SCn sequentially transitioning to logic high in response to a rising edge of the switch control signal SWCTL. The switch signals SC1 through SCn transition to logic high sequentially by time intervals P1 through Pn, respectively, after the rising edge of the switch control signal SWCTL. The time intervals may be determined by adjusting delay times of the delay buffers D1 through Dn. Responding to rising edges of the switch signals SC1 through SCn, the NMOS transistors MS1 through MSn are sequentially turned on and the conduction paths are formed between the output node NA and the reference node NB. As such, the current flowing through the output load can be dissipated and thus the pop-up noise can be reduced by forming at least one conduction path between the output node NA and the reference node NB.

As described above, while the conduction paths are formed, the class-D driving circuit 220 and the reference voltage generator 240 are powered on. Accordingly the pop-up noise is reduced or prevented by the conduction paths formed in parallel to the output load RL even though the voltage difference VA-VB is non-zero during initial period T1. After the voltages VA and VB of the nodes NA and NB are stabilized, the switch signals SC1 through SCn transition to logic low and the NMOS transistors MS1 through MSn are turned off.

Figure 8:
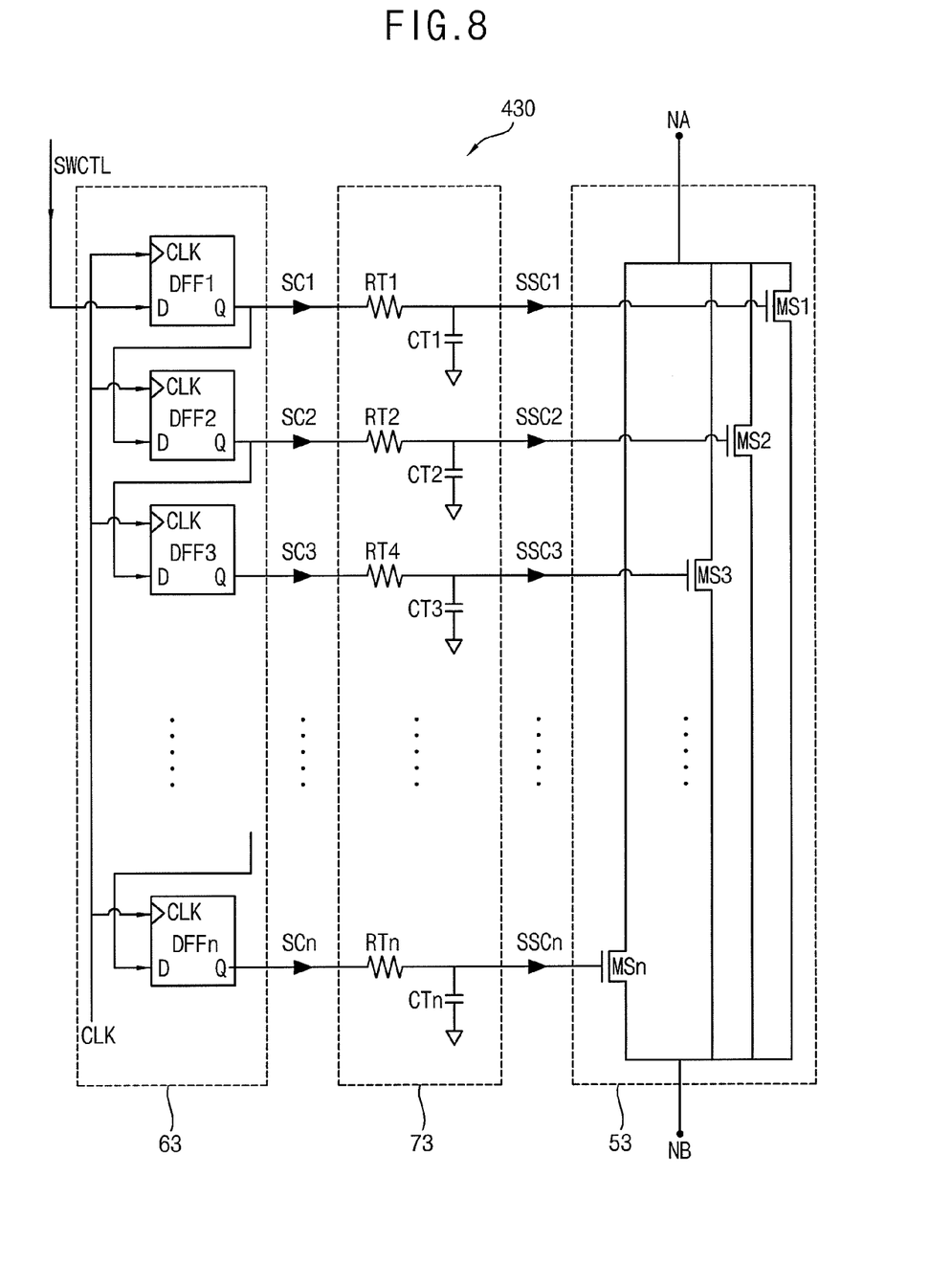
FIG. 8 is a circuit diagram illustrating a pop-up noise reduction circuit according to an exemplary embodiment of the present invention.

FIG. 8 is a circuit diagram illustrating a pop-up noise reduction circuit according to an exemplary embodiment of the present invention. Repeated descriptions with respect to the pop-up noise reduction circuit of FIG. 6 are omitted.

Referring to FIG. 8, the pop-up noise reduction circuit 430 includes a switch unit 53 and a switch signal generator 63, and may further include a smoothing unit 73.

As illustrated in FIG. 8, the switch signal generator 63 may include a plurality of flip-flops DFF1 through DFFn, which generate the switch signals SC1 through SCn in response to the switch control signal SWCTL and a clock signal CLK such that the switch signals SC1 through SCn transition to logic high sequentially in one clock cycle of the clock signal CLK. The delay times between the switch signals SC1 through SCn may each be as long as the one cycle of the clock signal CLK.

The voltages may be applied to both ends of the output load while the conduction path is formed between the output node and the reference node. As such, the pop-up noise reduction circuit can reduce the pop-up noise, which may be caused before the class-D driving circuit and the reference voltage generator are stabilized after the digital amplifier is powered on.

Figure 9:
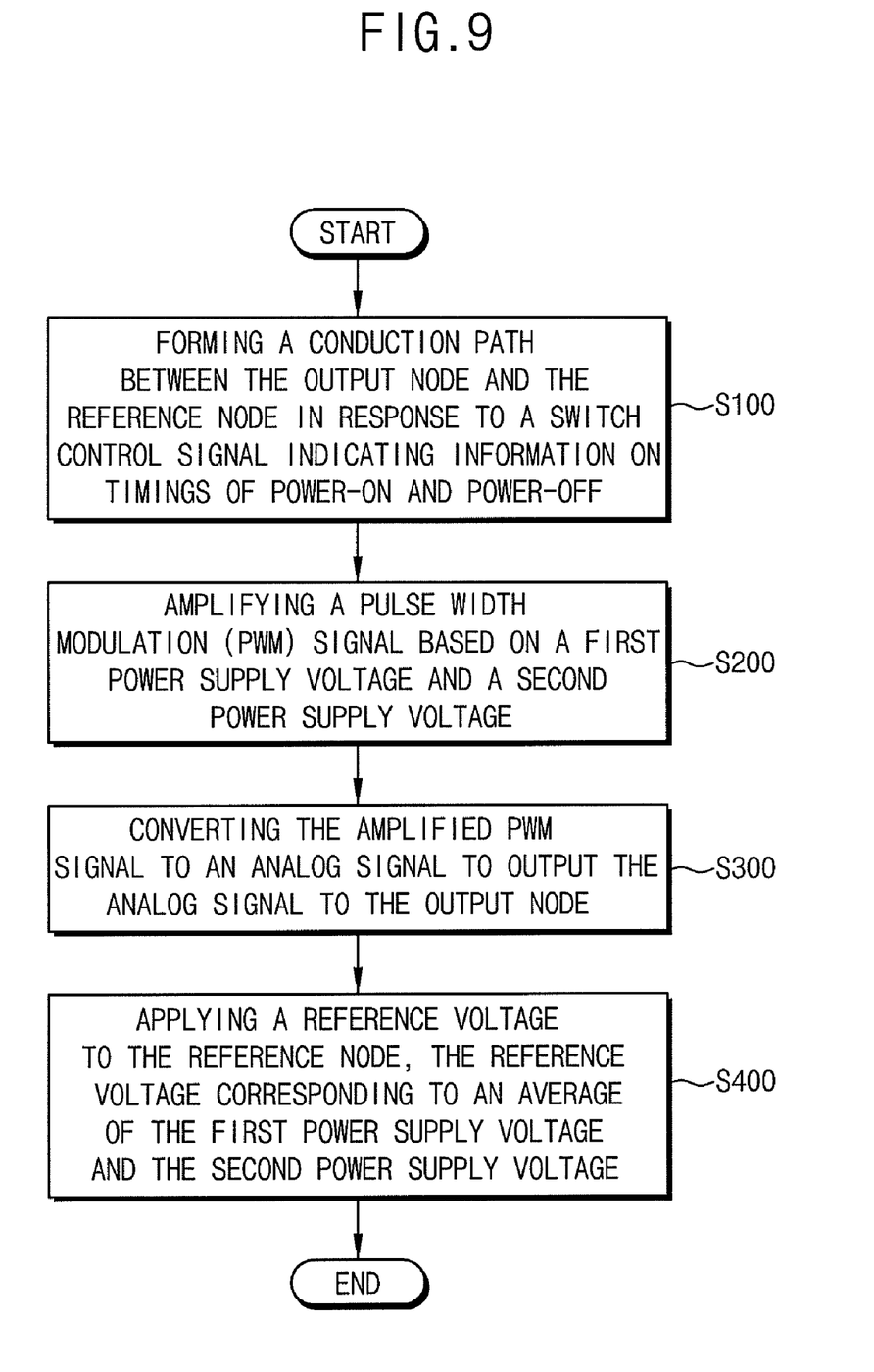
FIG. 9 is a flowchart illustrating a method of reducing a pop-up noise in a digital amplifier according to an exemplary embodiment of the present invention.

FIG. 9 is a flowchart illustrating a method of reducing a pop-up noise in a digital amplifier according to an exemplary embodiment of the present invention.

The method is provided to reduce a pop-up noise in a digital amplifier. The digital amplifier drives an output load that is coupled between an output node and a reference node. The output load may be included in a sound generation device such as a speaker.

In step S100, a conduction path is formed between the output node NA and the reference node NB in response to a switch control signal SWCTL indicating information on the timing of power-on and power-off. A pulse width modulation (PWM) signal according to an input audio signal is amplified based on a first power supply voltage and a second power supply voltage in step S200. The amplified PWM signal is converted to an analog signal and the analog signal is output to the output node in step S300. A reference voltage is applied to the reference node in step S400 such that the reference voltage corresponds to an average of the first power supply voltage and the second power supply voltage.

At least one switch may be coupled in parallel between the output node and the reference node. The switch is turned on in response to the switch control signal so that the conduction path may be formed. For example, the switch includes a plurality of NMOS transistors and the NMOS transistors may be sequentially turned on. The switch may be turned off after voltages of the output node and the reference node are stabilized. The NMOS transistors may have turn-on resistances different from each other, and the NMOS transistor having a higher turn-on resistance is turned on before the NMOS transistor having a lower turn-on resistance is turned on. As such the surge current flowing through the output load can be more effectively controlled, and thus the pop-up noise can be further reduced.

As described above, the digital amplifier including the pop-noise reduction circuit according to exemplary embodiments of the present invention can reduce the pop-up noise that may be caused when the digital amplifier is powered on or off, by forming the conduction path in parallel to the output load.

Furthermore the digital amplifier including the pop-noise reduction circuit according to exemplary embodiments of the present invention may be implemented with a system-on-chip, particularly of mobile devices requiring a small size.

While the exemplary embodiments of the present invention have been described in detail, it should be understood that various changes, substitutions and alterations may be made herein without departing from the scope of the invention.

What is claimed is:

1. A circuit for use in a digital amplifier, comprising:
   a switch unit coupled to an output load between an output node of the digital amplifier and a reference node, the switch unit configured to control a current flow through the output load by forming a conduction path between the output node and the reference node in response to a switch signal; and a switch signal generator configured to generate the switch signal in response to a switch control signal indicating a power-on or a power-off, wherein the switch unit comprises a plurality of NMOS transistors coupled in parallel to each other between the output node and the reference node, each gate of the NMOS transistors receiving a respective switch signal.

2. The circuit of claim 1, wherein a voltage at the reference node is maintained at an average of a first power supply voltage and a second power supply voltage during a normal operation of the digital amplifier.

3. The circuit of claim 2, wherein a voltage at the output node is maintained at the voltage of the reference node during a mute operation of the digital amplifier, and the voltage at the output node changes between the first power supply voltage and the second power supply voltage during the normal operation of the digital amplifier.

4. The circuit of claim 1, wherein the switch unit comprises a switch coupled between the output node and the reference node, the switch being configured to operate in response to the switch signal.

5. The circuit of claim 4, wherein the switch comprises an NMOS transistor, and the switch signal generator is configured to output the switch signal of logic high to a gate of the NMOS transistor when the digital amplifier is powered on or off.

6. The circuit of claim 1, further comprising a smoothing unit coupled between the switch signal generator and the switch unit, the smoothing unit being configured to prolong a transition time of the switch signal output to the switch unit.

7. The circuit of claim 6, wherein the smoothing unit comprises a plurality of RC circuits coupled to gates of the NMOS transistors, respectively, each RC circuit including a resistor and a capacitor.

8. The circuit of claim 1, wherein the switch signal generator is configured to generate a plurality of switch signals in response to the switch control signal, the plurality of switch signals being respectively output to each gate of the NMOS transistors, the plurality of switch signals sequentially transitioning to logic high.

9. The circuit of claim 8, wherein the switch signal generator comprises a plurality of delay buffers configured to sequentially delay the switch control signal to generate the plurality of switch signals sequentially transitioning to logic high.

10. The circuit of claim 8, wherein the switch signal generator comprises a plurality of flip-flops configured to generate the plurality of switch signals in response to the switch control signal and a clock signal such that the plurality of switch signals transition to logic high sequentially in one clock cycle of the clock signal.

11. The circuit of claim 1, wherein the NMOS transistors have different turn-on resistances.

12. The circuit of claim 11, wherein an NMOS transistor having a higher turn-on resistance is turned on before an NMOS transistor having a lower turn-on resistance is turned on.

13. A digital amplifier for driving an output load that is coupled between an output node and a reference node, comprising:

a class-D driving circuit configured to amplify a pulse width modulation (PWM) signal based on a first power supply voltage and a second power supply voltage and to output the amplified PWM signal;

a low-pass filter configured to convert the amplified PWM signal to an analog signal and to output the analog signal to the output node;

a reference voltage generator configured to output a reference voltage to the reference node, the reference voltage corresponding to an average of the first power supply voltage and the second power supply voltage; and a pop-up noise reduction circuit configured to control current flow through the output load by forming a conduction path between the output node and the reference node in response to a switch control signal indicating a power-on or a power-off, wherein the pop-up noise reduction circuit comprises:

a switch unit coupled in parallel to the output load between the output node and the reference node, the switch unit being configured to control the current flowing through the output load by forming N number of conduction paths between the output node and the reference node in response to N number of switch signals, where N is a natural number; and a switch signal generator configured to generate the N number of switch signals in response to the switch control signal.

14. The digital amplifier of claim 13, wherein a voltage at the output node is maintained at the reference voltage during a mute operation of the digital amplifier, and the voltage of the output node changes between the first power supply voltage and the second power supply voltage during a normal operation of the digital amplifier.

15. The digital amplifier of claim 13, wherein the switch unit comprises N number of MOS transistors coupled in parallel to each other between the output node and the reference node, each gate of the MOS transistors receiving the respective switch signal of the N number of switch signals.

16. The digital amplifier of claim 15, wherein the MOS transistors are NMOS transistors.

17. The digital amplifier of claim 16, wherein the switch signal generator is configured to generate the N number of switch signals in response to the switch control signal, the N number of switch signals being respectively output to each gate of the NMOS transistors, the switch signals sequentially transitioning to logic high.

18. The digital amplifier of claim 17, wherein the switch signal generator comprises a plurality of flip-flops configured to generate the N number of switch signals in response to the switch control signal and a clock signal such that the switch signals transition to logic high sequentially in one clock cycle of the clock signal.

19. The digital amplifier of claim 15, wherein the pop-up noise reduction circuit further comprises a smoothing unit coupled between the switch signal generator and the switch unit, the smoothing unit being configured to prolong transition times of the N number of switch signals output to the switch unit.

20. The digital amplifier of claim 19, wherein the smoothing unit comprises N number of RC circuits coupled to gates of the MOS transistors, respectively, each RC circuit including a resistor and a capacitor.

21. The digital amplifier of claim 15, wherein the MOS transistors have different turn-on resistances.

22. The digital amplifier of claim 21, wherein an MOS transistor having a higher turn-on resistance is turned on before an MOS transistor having a lower turn-on resistance is turned on.

23. A method of reducing a pop-up noise in a digital amplifier, the digital amplifier driving an output load that is coupled between an output node and a reference node, the method comprising:

forming a conduction path between the output node and the reference node in response to a switch control signal indicating a power-on or a power-off;

amplifying a pulse width modulation (PWM) signal based on a first power supply voltage and a second power supply voltage;

converting the amplified PWM signal to an analog signal and outputting the analog signal to the output node; and applying a reference voltage to the reference node, the reference voltage corresponding to an average of the first power supply voltage and the second power supply voltage, wherein the conduction path comprises a plurality of NMOS transistors coupled in parallel to each other between the output node and the reference node, each gate of the NMOS transistors receiving a respective switch signal.

24. The method of claim 23 wherein the NMOS transistors are sequentially turned on.

25. The method of claim 24, wherein the NMOS transistors have different turn-on resistances, and an NMOS transistor having a higher turn-on resistance is turned on before an NMOS transistor having a lower turn-on resistance is turned on.

* * * * *